United States Patent
Gokmen et al.

(10) Patent No.: US 11,501,148 B2
(45) Date of Patent: Nov. 15, 2022

(54) AREA AND POWER EFFICIENT IMPLEMENTATIONS OF MODIFIED BACKPROPAGATION ALGORITHM FOR ASYMMETRIC RPU DEVICES

(71) Applicant: INTERNATIONAL BUSINESS MACHINES CORPORATION, Armonk, NY (US)

(72) Inventors: Tayfun Gokmen, Briarcliff Manor, NY (US); Seyoung Kim, Weschester, NY (US); Murat Onen, Boston, MA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 406 days.

(21) Appl. No.: 16/808,811

(22) Filed: Mar. 4, 2020

(65) Prior Publication Data
US 2021/0279556 A1  Sep. 9, 2021

(51) Int. Cl.
*G06N 3/063* (2006.01)
*G11C 7/16* (2006.01)
(Continued)

(52) U.S. Cl.
CPC ............. *G06N 3/063* (2013.01); *G06F 17/16* (2013.01); *G06N 3/084* (2013.01); *G11C 7/16* (2013.01);
(Continued)

(58) Field of Classification Search
CPC ...... G06N 3/063; G06N 3/084; G06N 3/0635; G06F 17/16; G11C 7/16; G11C 11/54; G11C 13/0002; G11C 13/004
See application file for complete search history.

(56) References Cited

U.S. PATENT DOCUMENTS 5,047,655 A * 9/1991 Chambost ............ G06N 3/0635
                                                                708/801
9,779,355 B1   10/2017 Leobandung
(Continued)

OTHER PUBLICATIONS

Gokmen et al. "Acceleration of Deep Neural Network Training with Resistive Cross-Point Devices: Design Considerations". Frontiers in Neuroscience. 2016. 25p.
(Continued)

*Primary Examiner* — Jerome Leboeuf
(74) *Attorney, Agent, or Firm* — Cantor Colburn LLP; Daniel Yeates

(57) ABSTRACT

A device configured to implement an artificial intelligence deep neural network includes a first matrix and a second matrix. The first matrix resistive processing unit ("RPU") array receives a first input vector along the rows of the first matrix RPU. A second matrix RPU array receives a second input vector along the rows of the second matrix RPU. A reference matrix RPU array receives an inverse of the first input vector along the rows of the reference matrix RPU and an inverse of the second input vector along the rows of the reference matrix RPU. A plurality of analog to digital converters are coupled to respective outputs of a plurality of summing junctions that receive respective column outputs of the first matrix RPU array, the second matrix RPU array, and the reference RPU array and provides a digital value of the output of the plurality of summing junctions.

17 Claims, 5 Drawing Sheets

(51) Int. Cl.
G06N 3/08 (2006.01)
G06F 17/16 (2006.01)
G11C 11/54 (2006.01)
G11C 13/00 (2006.01)

(52) U.S. Cl.
CPC .......... *G11C 11/54* (2013.01); *G11C 13/0002* (2013.01); *G11C 13/004* (2013.01)

(56) References Cited

U.S. PATENT DOCUMENTS

| | | | |
|---|---|---|---|
| 10,319,439 B1 | 6/2019 | Li et al. | |
| 10,332,004 B2 | 6/2019 | Kataeva et al. | |
| 10,497,442 B1* | 12/2019 | Kumar | G06F 17/16 |
| 2017/0109626 A1 | 4/2017 | Gokmen et al. | |
| 2017/0109628 A1 | 4/2017 | Gokmen et al. | |
| 2017/0286830 A1 | 10/2017 | El-Yaniv et al. | |
| 2018/0300627 A1* | 10/2018 | Gokmen | G06N 3/08 |
| 2018/0373902 A1* | 12/2018 | Muralimanohar | G11C 13/00 |
| 2019/0221263 A1* | 7/2019 | Lee | G11C 16/08 |

OTHER PUBLICATIONS

Gokmen, et al. "Training deep convolutional neural networks with resistive cross-point devices," Frontiers in Neuroscience vol. 11, 2017, Article 538, 25 pp.

Krestinskaya, et al. "Learning in Memristive Neural Network Architectures using Analog Backpropagation Circuits" IEEE Transactions on Circuits and Systems I: Regular Papers, vol. 66, No. 2, 2019. 14p.

Tayfun Gokmen, Malte Rasch, and Wilfried Haensch, "Training LSTM networks with resistive cross-point devices," Frontiers in Neuroscience, vol. 12, 2018, Article 745, 21 pp.

* cited by examiner

AREA AND POWER EFFICIENT IMPLEMENTATIONS OF MODIFIED BACKPROPAGATION ALGORITHM FOR ASYMMETRIC RPU DEVICES

BACKGROUND

The present invention generally relates to resistive processing units and more specifically, to area and power efficient implementations of modified backpropagation algorithms for asymmetric resistive processing unit ("RPU") devices.

Deep neural networks ("DNN's") have become ever more important in recent years. As training a DNN takes a great deal of computational capacity and training time, there has been a search for more efficient methods other than use of a traditional microprocessor in conjunction with a graphics processor. One solution has been the use of RPU's that simultaneously store and process weights that are used in DNN's.

SUMMARY

Embodiments of the present invention are directed to area and power efficient implementations of modified backpropagation algorithms for asymmetric RPU devices. A first matrix resistive processing unit ("RPU") array having rows and columns including a plurality of resistors coupled between its respective rows and columns receives a first input vector along the rows of the first matrix RPU. A second matrix RPU array having rows and columns including a plurality of resistors coupled between its respective rows and columns receives a second input vector along the rows of the second matrix RPU. A reference matrix RPU array having rows and columns storing a reference vector in a plurality of resistors coupled between its respective rows and columns receives an inverse of the first input vector along the rows of the reference matrix RPU and an inverse of the second input vector along the rows of the reference matrix RPU. A plurality of analog to digital converters are coupled to respective outputs of a plurality of summing junctions that receive respective column outputs of the first matrix RPU array, the second matrix RPU array, and the reference RPU array and provides a digital value of the output of the plurality of summing junctions.

Other embodiments of the present invention are directed to area and power efficient implementations of modified backpropagation algorithm for asymmetric RPU devices. A first matrix resistive processing unit ("RPU") array having rows and columns includes a plurality of resistors coupled between its respective rows and columns and receives a first input vector along the rows of the first matrix RPU array. A second matrix RPU array having rows and columns includes a plurality of resistors coupled between its respective rows and columns and receives a second input vector along the rows of the second matrix RPU array. A reference matrix RPU array having rows and columns stores a reference vector in a plurality of resistors coupled between its respective rows and columns and receives an inverse of the first input vector along the rows of the reference matrix RPU array and an inverse of the second input vector along the rows of the reference matrix RPU array. A first plurality of analog to digital converters coupled to respective outputs of a plurality of summing junctions receives respective column outputs of the first matrix RPU array and the reference RPU array and provides a digital value of the sum of the output of the first matrix RPU array and the reference RPU. A second plurality of analog to digital converters coupled to respective outputs of a plurality of summing junctions receives respective column outputs of the second matrix RPU array and the reference RPU array and provides a digital value of an output of the summing junctions.

A method in accordance with embodiments of the present invention provides a method for use in artificial intelligence implementing a deep neural network. The method receives a first error vector in a column input of a first matrix RPU array and receives a second error vector in a second matrix RPU array. A row input of the first matrix RPU array receives a first input vector and a row input of the second matrix RPU array receives a second input vector. A row input of a reference matrix RPU array receives an inverse of the first input vector and an inverse of the second input vector. The method sums a columnar output of the first matrix RPU array, the second matrix RPU array, and the reference matrix RPU array to provide an output of the first vector and the second vector.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagrams or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

DETAILED DESCRIPTION

One or more embodiments of the present invention provide area and power efficient implementations of modified backpropagation algorithms for asymmetric RPU devices. In order to relax symmetry requirements of DNN's, embodiments of the present invention utilize three resistive crosspoint arrays, or RPU arrays, for storing and processing data locally and in parallel. A single reference RPU array is coupled to a first main RPU array and a second main RPU array. A first vector, $v_{A,1}$, is an input into the first main RPU array. A second vector, $v_{C,1}$, is an input into the second main RPU array. Inverted values of the first vector and the second vector are input into the reference RPU array. Outputs of the reference RPU array, the first RPU array, and the second RPU array are summed and fed into an analog to digital converter which provides the output of the product of the first input vector and the second input vector.

DNN's have been moving to using RPU arrays for, not just memory applications, but also for intensive DNN training workloads. When used in learning algorithms, an important requirement is that traditional use of RPU's requires that the RPU's, which are analog resistive devices, must change conductance symmetrically when subjected to positive or negative voltage pulse stimuli. Significant work has gone into developing new material stacks to achieve the required symmetry.

Figure 1:
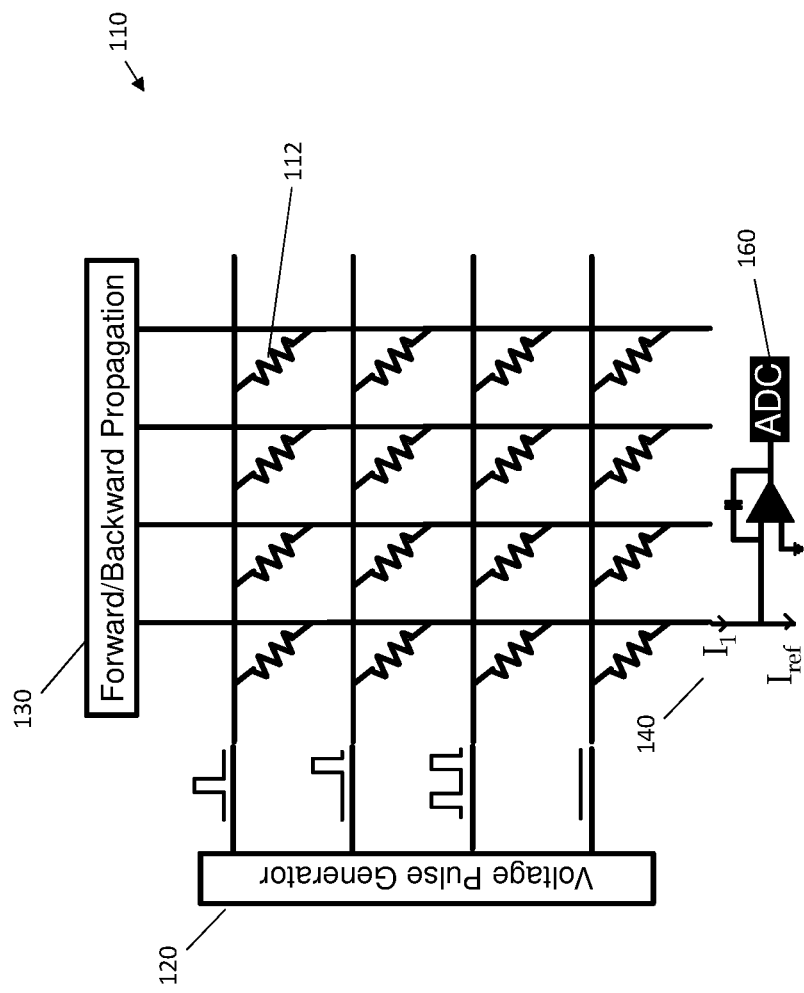
FIG. 1 illustrates a diagram of components of an RPU used in DNN training in accordance with one or more embodiments of the present invention.

FIG. 1 illustrates a diagram of components of an RPU used in DNN training in accordance with one or more embodiments of the present invention. An RPU 110 includes an array of two-terminal analog resistors 112, configured and arranged as shown. The conductances of the two-terminal analog resistors 112 serve as a weight matrix. An output vector is the current I1 in each column which is converted to a digital value by an operational amplifier coupled to an analog to digital converter 150. While only a single operational amplifier and analog to digital converter pair 150 is shown, each column has its own operational amplifier and analog to digital converter pair 150.

In a forward cycle, stored conductance values in the RPU 110 form a matrix, and an input vector from pulse generator 120 are transmitted as voltage pulses through each of the input rows on the left side of the RPU 110. In a backward cycle, voltage pulses are supplied via forward/backward propagation 130 as an input and a vector-matrix product is computed on the transpose of the matrix. Thus, large vector-matrix multiplication can be computed in a single time step. RPU's 110 can achieve up to 30,000 times improved power efficiency compared to an equivalent CPU and GPU.

A conventional algorithm using RPU's 110 in a DNN implements the following formulas, where W is the sum of two matrices, A and C:

$$y=Wx,$$

$$z=W^T\delta, \text{ and}$$

$$W \leftarrow W+\eta(\delta \otimes x),$$

where y is the backward pass, x is the forward pass, z is the output, $\delta$ is error computed at an output neuron, and $\eta$ is a global learning rate.

As previously stated, symmetry requirements are strict for conventional RPU 110 use in DNN's. Increasing asymmetry causes performance degradation when using RPU's 110 in DNN's.

One proposed solution to reduce the symmetry requirements of RPU 110 use in a DNN is a modified backpropagation algorithm implemented through the use of a four RPU 110 device to perform the large-vector matrix multiplication required in a DNN. The modified backpropagation algorithm uses the following equations:

$$y=(A+C)x,$$

$$y'=Ax',$$

$$z=(A+C)^T\delta,$$

$$A \leftarrow A+\eta(\delta \otimes x), \text{ and}$$

$$C \leftarrow C+\lambda(y' \otimes x'),$$

where W is the sum of two matrices A and C, held in two sets of arrays, x' is a vector that changes each iteration, y and x are the backward pass and the forward pass, respectively, $\delta$ is error computed at an output neuron, $\eta$ is a global learning rate, and $\lambda$ is a scalar controller the learning rate on C. Backpropagation updates the matrix A. C is updated using the signal propagated through A. x' can be, for example, one hot encoded vectors, orthogonal vectors of a Hadamard matrix, random inputs, or the same activations used during a forward pass, x. A Hadamard matrix is a square matrix whose entries are either +1 or −1 and whose rows are mutually orthogonal.

Figure 2:
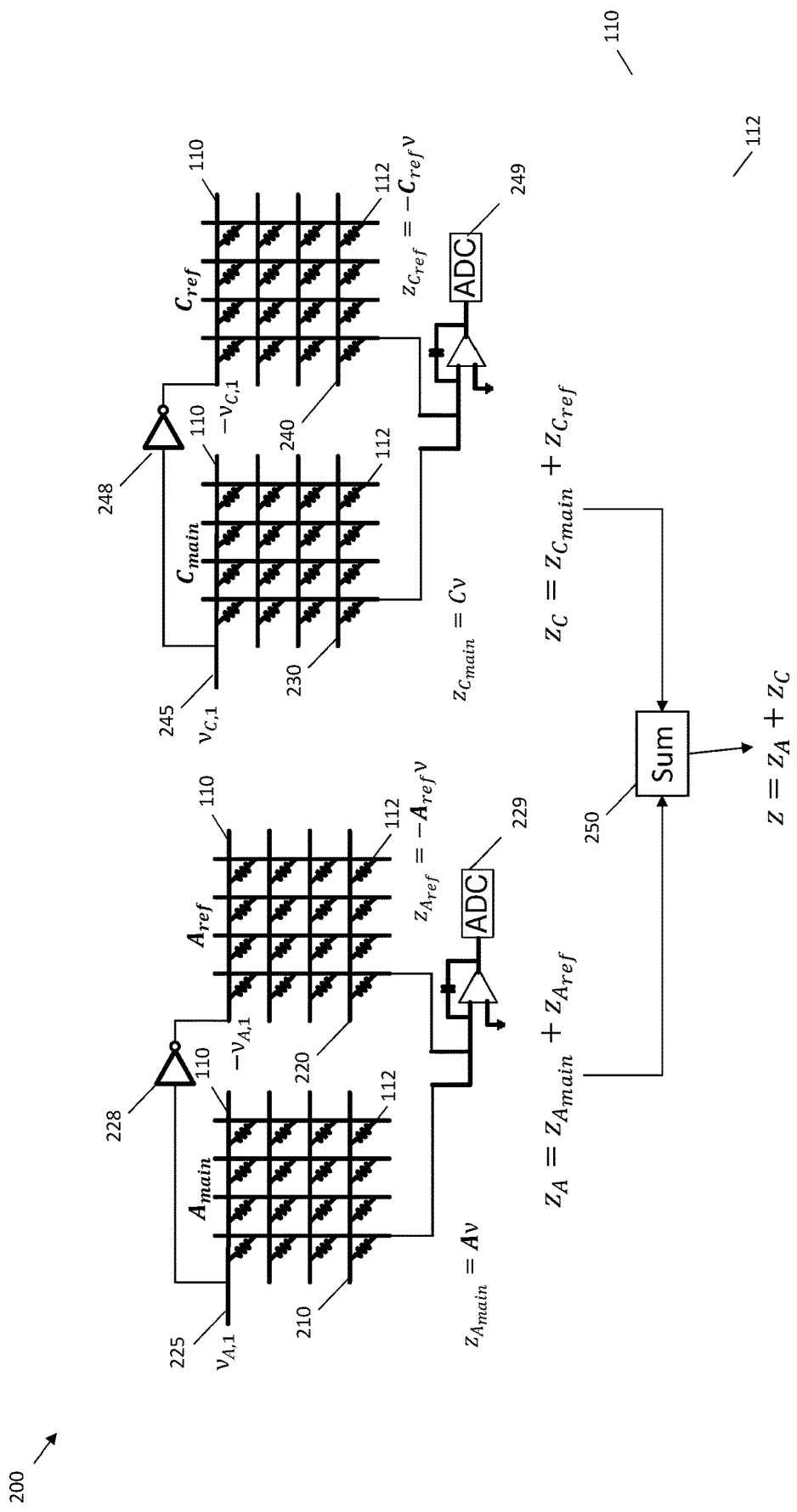
FIG. 2 illustrates a diagram of components of a four RPU device array used in DNN training to implement a modified backpropagation algorithm.

FIG. 2 illustrates a diagram of components of a four RPU 110 device array used in DNN training to implement the algorithm described above. Where two matrices A and C are used to rank-1 update, there are provided four RPU 110 arrays. A first matrix RPU 110 array, Amain, 210 serves as the main array for matrix A. A first reference RPU 110 array, Aref, 220 serves as the reference array for matrix A. A second matrix RPU 110 array, Cmain, 230 serves as the main array for matrix C. A second reference matrix RPU 110 array, Cref, 240 serves as the reference array for matrix C.

The input to first matrix RPU 110 array, Amain, 210 is first input vector, $v_{A,1}$, 225. This input is inverted through a first inverter 228 and provided as the input, $-v_{A,1}$, to first reference RPU 110 array, Aref, 220. The input to second matrix RPU 110 array, Cmain, 230 is second input vector, v, 245. This input is inverted through a second inverter 248 and provided as the input, $-v_{C,1}$, to second reference matrix RPU 110 array, Cref, 240.

An output, $z_{A_{main}}=Av$, of first matrix RPU 110 array, Amain, 210 and an output, $z_{A_{ref}}=-A_{ref}v$, of first reference matrix RPU 110 array, Aref, 220 are summed and fed into first operational amplifier and first analog to digital converter pair 229, such that $z_A=z_{A_{main}}+z_{A_{ref}}$. An output, $z_{C_{main}}=Cv$, of second matrix RPU 110 array, Cmain, 230 and an output, $z_{C_{ref}}=-C_{ref}v$, of second reference matrix RPU 110 array, Cref, 240 are summed and fed into second operational amplifier and second analog to digital converter pair 249, such that $z_C=z_{C_{main}}+z_{C_{ref}}$. While only a single operational amplifier and analog to digital converter pair is shown, each column has its own operational amplifier and analog to digital converter pair. The outputs of the analog to digital converter 229, ZA, and the second analog to digital converter 249, ZC, are summed to provide the output, Z, of the two input matrices, A and C.

$A_{ref}$ and $C_{ref}$ are adjusted to their symmetry points to ensure when A and C are 0, $A_{main}$ and $C_{main}$ elements are placed at their symmetry points. This ensures accurate weight tuning of the device around a zero point. The above four RPU 110 device array ensures $A_{main}$ to be modified around zero where C goes to the target value.

One or more embodiments of the present invention provide technological improvements over current implementations of the modified backpropagation algorithm that requires four matrix RPU 110 arrays. One or more embodiments of the present invention provide technical solutions to one or more of these disadvantages of existing solutions by implementing the modified backpropagation algorithm using three matrix RPU 110 arrays instead of four. This reduces the implementation footprint of the prior implementations by 25% with a comparable savings in power consumption.

Figure 3:
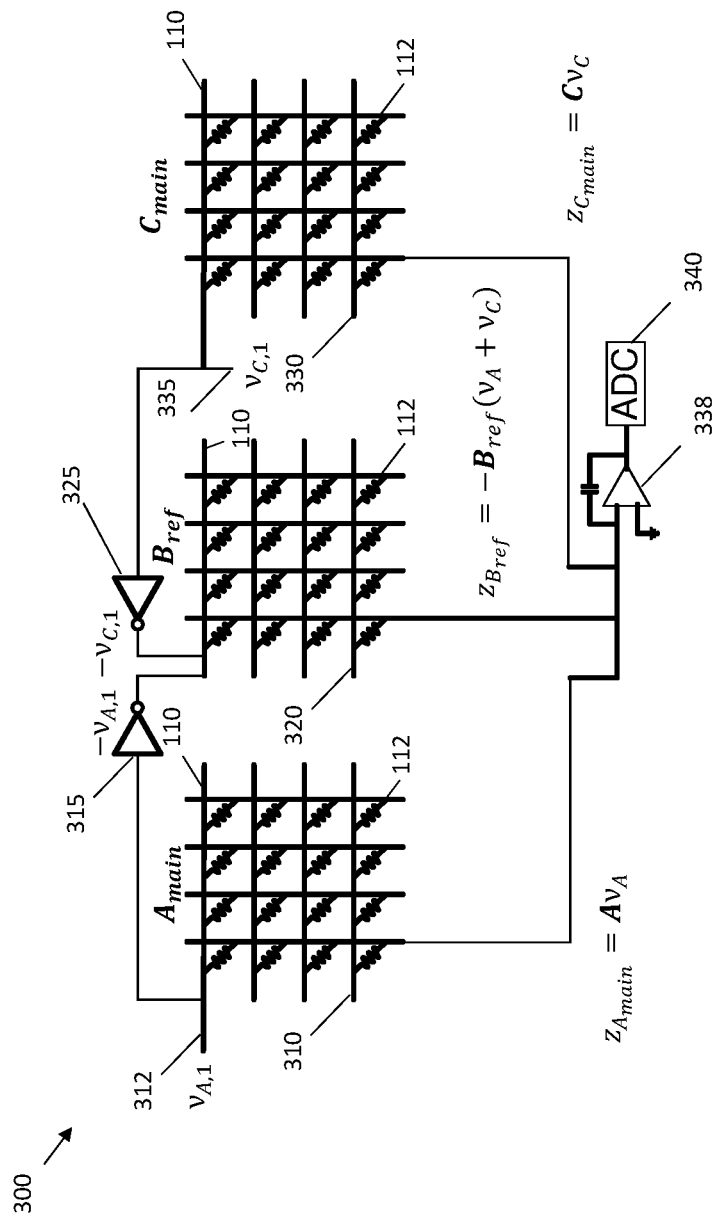
FIG. 3 illustrates a first embodiment of a device implementing a modified backpropagation algorithm for asymmetric RPU devices in accordance with one or more embodiments of the present invention.

Turning now to FIG. 3, a first embodiment of a device implementing a modified backpropagation algorithm for asymmetric RPU 110 devices is generally shown in accordance with one or more embodiments of the present invention. Where two matrices A and C are used to rank-1 update, there is provided three matrix RPU 110 arrays in a device 300. A first matrix RPU 110 array, Amain, 310 serves as the main array for matrix A. A reference matrix RPU 110 array, Bref, 320 serves as the reference array for both matrix A and matrix C. A second matrix RPU 110 array, Cmain, 330 serves as the main array for matrix C. A second reference matrix RPU 110 array is not needed because C gets updates much slower and less often than A. The absence of many updates that are of an opposite sign reduces its sensitivity with respect to symmetry. Therefore the reference array for A is also used as the reference array for B.

The input to first matrix RPU 110 array, Amain, 310 is first input vector, $v_{A,1}$, 312. This input is inverted through a first inverter 315 and provided as an input, $-v_{A,1}$, to reference RPU 110 array, Bref, 320. The input to second matrix RPU 110 array, Cmain, 330 is second input vector, $v_{C,1}$, 335. This input is inverted through a second inverter 325 and provided as an input, $-v_{C,1}$, to reference matrix RPU 110 array, Bref, 320.

An output, $Z_{A_{main}} = A*v_A$ of first matrix RPU 110 array, Amain, 310, an output, $Z_{Bref} = -Br_{ef}*(v_A+v_C)$, of reference matrix RPU 110 array, Bref, 320, and an output, $z_{C_{main}} = C*v_C$ of the second matrix RPU 110 array, Cmain, 330 are summed at a summing junction including an operational amplifier 338 that feeds into analog to digital converter 340. While only a single operational amplifier 338 and analog to digital converter 340 pair is shown, each column has its own operational amplifier and analog to digital converter pair. The output of the analog to digital converter 340 provides the output, Z, of the two input matrices, A and C.

If it is desired that the A matrix be read, vC can be set to zero. If it is desired that matrix C be read, vA can be set to zero. If it is desired that the product of A and C be read, then vA can be set to equal vC.

Figure 4:
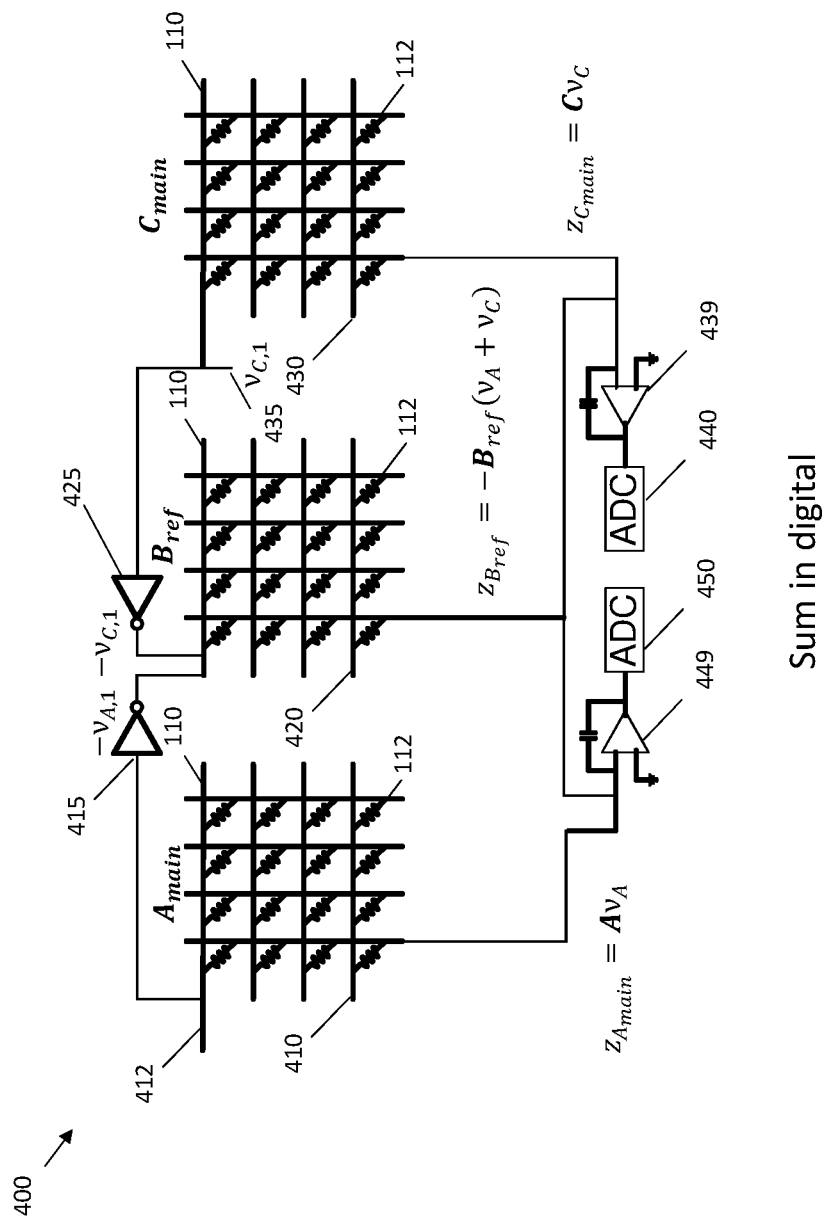
FIG. 4 illustrates a second embodiment of a device implementing a modified backpropagation algorithm for asymmetric RPU devices in accordance with one or more embodiments of the present invention.

FIG. 4 illustrates a second embodiment of a device implementing a modified backpropagation algorithm for asymmetric RPU 110 devices in accordance with one or more embodiments of the present invention. To avoid saturation of the operational amplifier the final summation is done digitally. This also avoids additional noise coming from the other matrix when reading them individually at the expense of an additional operational amplifier per column.

There are provided three matrix RPU 110 arrays in a device 400. A first matrix RPU 110 array, Amain, 410 serves as the main array for matrix A. A reference matrix RPU 110 array, Bref, 420 serves as the reference array for both matrix A and matrix C. A second matrix RPU 110 array, Cmain, 430 serves as the main array for matrix C. As previously stated, a second reference RPU 110 array is not needed because C gets updates much slower and less often than A. The absence of many updates that are of an opposite sign reduces its sensitivity with respect to symmetry. Therefore the reference array for A is also used as the reference array for B.

The input to first matrix RPU 110 array, Amain, 410 is first input vector, $v_{A,1}$, 412. This input is inverted through a first inverter 415 and provided as an input, $-v_{A,1}$, to reference RPU 110 array, Bref, 420. The input to second matrix RPU 110 array, Cmain, 430 is second input vector, $v_{C,1}$, 435. This input is inverted through a second inverter 425 and provided as an input, $-v_{C,1}$, to reference matrix RPU 110 array, Bref, 420.

An output, $Z_{A_{main}} = Av_A$, of first matrix RPU 110 array, Amain, 410, and an output, $Z_{Bref} = -B_{ref}(V_A+v_C)$, of reference matrix RPU 110 array, Bref, 420 are summed at a first summing junction including an operational amplifier 449 that feeds into analog to digital converter 450. An output, $z_{C_{main}} = CvC$, of the second matrix RPU 110 array, Cmain, 430 and the output, $Z_{Bref} = -Bref(vA+vB)$, of reference matrix RPU 110 array, Bref, 420 are summed at a second summing junction including an operational amplifier 439 that feeds into analog to digital converter 440. While only a single operational amplifier and analog to digital converter pair is shown, each column has its own operational amplifier and analog to digital converter pair. The outputs of the analog to digital converter 450 and the analog to digital converter 440 are digitally summed by a processor and provide the output, Z, of the two input matrices, A and C.

If it is desired that the A matrix by read, vC can be set to zero. If it is desired that matrix C be read, vA can be set to zero. If it is desired that the product of A and C be read, then vA can be set to equal vC.

Figure 5:
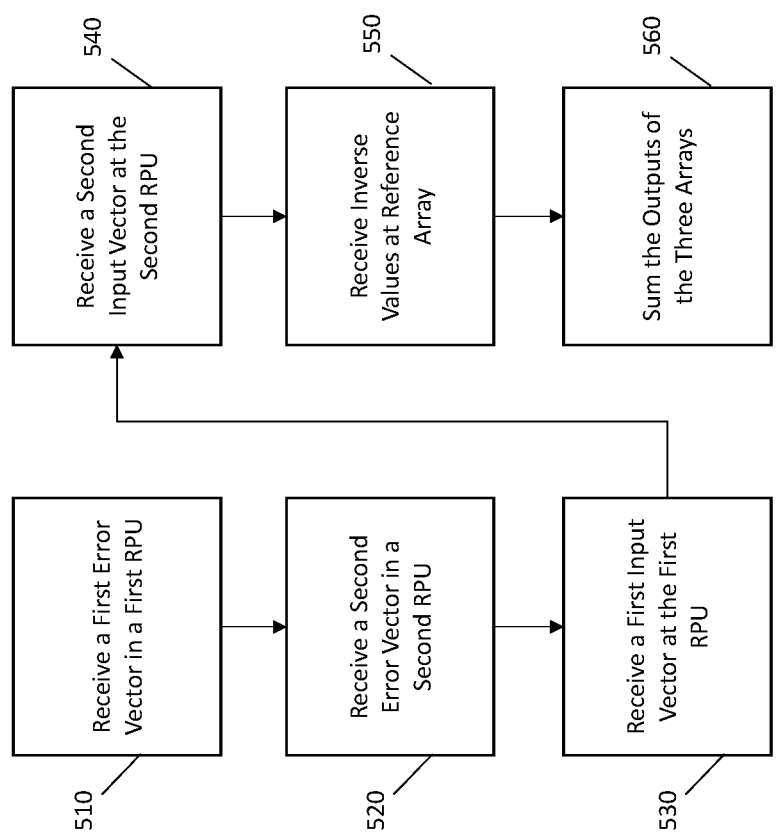
FIG. 5 illustrates a flow diagram of a process for calculating the output of a function of two vectors in accordance with one or more embodiments of the present invention.

FIG. 5 illustrates a flow diagram of a process for calculating the output of a function of two vectors in accordance with one or more embodiments of the present invention. While the blocks are shown in a particular sequence, no particular sequence is required, and several blocks can be performed simultaneously. The method stores a first error vector in a column input of the first matrix RPU array. (Block 510). The method receives a second error vector in a second matrix RPU array. (Block 520). The method receives a first input vector at a row input of the first matrix RPU array (block 530) and receives a second input vector at a row input of the second matrix RPU array. (Block 540). The method receives an inverse of the first input vector and an inverse of the second input vector at a row input of a reference matrix RPU array (block 550) and sums the columnar output of the first matrix RPU array, the second matrix RPU array, and the reference matrix RPU array to provide an output of the first input vector and the second input vector. (Block 560).

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

One or more of the methods described herein can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present detailed description has been presented for purposes of illustration and description, but is not intended to be exhaustive or limited to the form described. Many modifications and variations will be apparent to those of ordinary skill in the art without departing from the scope and spirit of the embodiments of the invention. The embodiments of the invention were chosen and described in order to best explain the principles of the disclosure and the practical application, and to enable others of ordinary skill in the art to understand the detailed description for various embodiments of the invention with various modifications as are suited to the particular use contemplated.

The diagrams depicted herein are illustrative. There can be many variations to the diagram or the steps (or operations) described therein without departing from the spirit of the detailed description. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present detailed description.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A device for use in artificial intelligence implementing a deep neural network, the device comprising:
    a first matrix resistive processing unit ("RPU") array having rows and columns including a first plurality of resistors coupled between its respective rows and columns and receiving a first input vector along the rows of the first matrix RPU array;
    a second matrix RPU array having rows and columns including a second plurality of resistors coupled between its respective rows and columns and receiving a second input vector along the rows of the second matrix RPU array;
    a reference matrix RPU array having rows and columns storing a reference vector in a third plurality of resistors coupled between its respective rows and columns receiving an inverse of the first input vector along the rows of the reference matrix RPU array and an inverse of the second input vector along the rows of the reference matrix RPU array; and
    a plurality of analog to digital converters coupled to respective outputs of a plurality of summing junctions that receive respective column outputs of the first matrix RPU array, the second matrix RPU array, and the reference RPU array that provides a digital value of the output of the plurality of summing junctions,
    wherein the reference matrix RPU array is adjusted such that when the first input vector and the second input vector are zero, the first matrix RPU array is placed at its symmetry point.

2. The device of claim 1 further comprising a first inverter coupled between input rows of the first matrix RPU array and input rows of the reference matrix RPU array.

3. The device of claim 1 further comprising a second inverter coupled between input rows of the second matrix RPU array and the inputs rows of the reference matrix RPU array.

4. The device of claim 1 wherein each of the plurality of summing junctions comprises an operational amplifier that receives the column outputs of the first matrix RPU array, the second matrix RPU array, and the reference RPU array at a first input and provides a sum of the column outputs of the first matrix RPU array, the second matrix RPU array, and the reference matrix RPU array at its output that is fed to its respective analog to digital converter.

5. The device of claim 1, wherein when the first input vector is set to zero, the output of the analog to digital converter is proportional to the reference vector less the second input vector.

6. The device of claim 1, wherein when the second input vector is set to zero, the output of the analog to digital converter is proportional to the reference vector less the first input vector.

7. A device for use in artificial intelligence implementing a deep neural network, the device comprising:
   a first matrix resistive processing unit ("RPU") array having rows and columns including a first plurality of resistors coupled between its respective rows and columns and receiving a first input vector along the rows of the first matrix RPU;
   a second matrix RPU array having rows and columns including a second plurality of resistors coupled between its respective rows and columns and receiving a second input vector along the rows of the second matrix RPU array;
   a reference matrix RPU array having rows and columns storing a reference vector in a third plurality of resistors coupled between its respective rows and columns receiving an inverse of the first input vector along the rows of the reference matrix RPU array and an inverse of the second input vector along the rows of the reference matrix RPU array;
   a first plurality of analog to digital converters coupled to respective outputs of a first plurality of summing junctions that receive respective column outputs of the first matrix RPU array and the reference matrix RPU array and provides a digital value of a sum of the output of the first matrix RPU array and the reference RPU array; and
   a second plurality of analog to digital converters coupled to respective outputs of a second plurality of summing junctions that receive respective column outputs of the second matrix RPU array and the reference RPU array and provides a digital value of an output of the second plurality of summing junctions,
   wherein the reference matrix RPU array is adjusted such that when the first vector and the second vector are zero, the first matrix RPU array is placed at its symmetry point.

8. The device of claim 7 further comprising a first inverter coupled between input rows of the first matrix RPU array and the inputs rows of the reference matrix RPU array.

9. The device of claim 7 further comprising a second inverter coupled between input rows of the second matrix RPU array and the inputs rows of the reference matrix RPU array.

10. The device of claim 7, wherein each of the first plurality of summing junctions comprises an operational amplifier that receives the column outputs of the first matrix RPU array and the reference matrix RPU array at a first input and provides the a sum of the column outputs of the first matrix RPU array and the reference matrix RPU array at its output that is fed to its respective analog to digital converter.

11. The device of claim 10, wherein each of the second plurality of summing junctions comprises an operational amplifier that receives the column outputs of the second matrix RPU array and the reference matrix RPU array at a second input and provides the sum of the column outputs of the second matrix RPU array and the reference RPU array at its output that is fed to its respective analog to digital converter.

12. The device of claim 7 further comprising a processor to digitally sum the output of the first analog to digital converter and the second analog to digital converter.

13. A method for use in artificial intelligence implementing a deep neural network, comprising:
   storing a first error vector in a column input of a first matrix RPU array;
   receiving a second error vector in a second matrix RPU array and setting the second error vector to zero;
   receiving a first input vector at a row input of the first matrix RPU array;
   receiving a second input vector at a row input of the second matrix RPU array;
   receiving an inverse of the first input vector and an inverse of the second input vector at a row input of a reference matrix RPU array; and
   summing a columnar output of the first matrix RPU array, the second matrix RPU array, and the reference matrix RPU array to provide an output of the first vector and the second vector.

14. The method of claim 13 further comprising converting the output from analog to digital.

15. The method of claim 13 further comprising setting the first error vector to zero.

16. The method of claim 13 further comprising setting the first error vector to be the same value as the second error vector.

17. The method of claim 13 further comprising adjusting the reference matrix RPU array such that when the first input vector and the second input vector are zero, the first RPU matrix array is placed at its symmetry point.

* * * * *